United States Patent
Heinrich et al.

(10) Patent No.: US 8,046,658 B2
(45) Date of Patent: Oct. 25, 2011

(54) METHOD AND DEVICE FOR DECODING BLOCKS ENCODED WITH AN LDPC CODE

(75) Inventors: Vincent Heinrich, La Tronche (FR); Pascal Urard, Theys (FR)

(73) Assignee: STMicroelectronics SA, Montrouge (FR)

( * ) Notice: Subject to any disclaimer, the term of this patent is extended or adjusted under 35 U.S.C. 154(b) by 1114 days.

(21) Appl. No.: 11/834,198

(22) Filed: Aug. 6, 2007

(65) Prior Publication Data

US 2008/0052596 A1 Feb. 28, 2008

(30) Foreign Application Priority Data

Aug. 24, 2006 (FR) ...................................... 06 07489

(51) Int. Cl.
*H03M 13/00* (2006.01)
(52) U.S. Cl. ........................................ 714/752; 714/786
(58) Field of Classification Search .................. 714/752, 714/786
See application file for complete search history.

(56) References Cited

U.S. PATENT DOCUMENTS

| | | | | |
|---|---|---|---|---|
| 7,260,762 | B2 * | 8/2007 | Desai et al. | 714/755 |
| 7,484,158 | B2 * | 1/2009 | Sharon et al. | 714/755 |
| 7,577,892 | B1 * | 8/2009 | He | 714/755 |
| 7,590,929 | B2 * | 9/2009 | Morita et al. | 714/800 |
| 7,669,106 | B1 | 2/2010 | Farjadrad | 714/800 |
| 7,707,479 | B2 * | 4/2010 | Niu et al. | 714/758 |
| 7,770,090 | B1 * | 8/2010 | Kons et al. | 714/780 |
| 2004/0255228 | A1 | 12/2004 | Shen et al. | 714/792 |
| 2005/0138519 | A1 | 6/2005 | Boutillon et al. | 714/752 |
| 2005/0229087 | A1 | 10/2005 | Kim et al. | 714/800 |
| 2006/0005104 | A1 | 1/2006 | Harada | 714/758 |
| 2006/0036923 | A1 | 2/2006 | Hedberg et al. | 714/752 |
| 2006/0085720 | A1 | 4/2006 | Tran et al. | 714/758 |
| 2006/0107181 | A1 | 5/2006 | Dave et al. | 714/758 |

FOREIGN PATENT DOCUMENTS

WO WO2006/020934 2/2006

OTHER PUBLICATIONS

Bhatt et al., "*Pipelined Block-Serial Decoder Architecture for Structured LDPC Codes*,"ICASSP 2006, Proceedings of the International Conference on Acoustics, Speech and Signal Processing, Toulouse, France, May 14-19, 2006, pp. IV-225-IV-228.

* cited by examiner

*Primary Examiner* — Esaw Abraham
(74) *Attorney, Agent, or Firm* — Lisa K. Jorgenson; Allen, Dyer, Doppelt, Milbrath & Gilchrist, P.A.

(57) ABSTRACT

A method is for decoding a succession of blocks of data encoded with an LDPC code. The method includes storing the blocks temporarily and successively in an input memory before decoding the blocks successively in an iterative manner, the input memory having a memory size for storage of at least two blocks, and defining a current indication representative of a threshold number of iterations for decoding a current block. The method includes decoding the current block until a decoding criterion is satisfied or so long as a number of iterations performed for decoding the current block has not reached the current indication while at least one of a first subsequent block and a part of a second subsequent block are stored in the input memory, and updating the current indication for decoding the first subsequent block as a function of the number of iterations performed for decoding the current block.

19 Claims, 6 Drawing Sheets

METHOD AND DEVICE FOR DECODING BLOCKS ENCODED WITH AN LDPC CODE

CROSS REFERENCE TO RELATED APPLICATION

This application is a translation of and claims the priority benefit of French patent application number 0607489 filed on Aug. 24, 2006, entitled "METHOD AND DEVICE FOR DECODING BLOCKS ENCODED WITH AN LDPC CODE", which is hereby incorporated by reference in its entirety.

FIELD OF THE INVENTION

The invention relates to the decoding of block-based codes, such as, for example, the block-based codes whose parity matrix exhibits low density, that is to say comprises a low number of 1s. Such codes are better known by a person skilled in the art as "LDPC" ("Low Density Parity Check") codes. This applies advantageously, but without limitation to, the LDPC codes used in the DVB-S2 standard, in particular, for satellite transmissions.

BACKGROUND OF THE INVENTION

The LDPC code is a block-based code. The encoder processes blocks of K bits and delivers blocks of N bits. Thus, N-K redundancy bits are added. These N-K bits are called "parity bits". The coding rate (or code rate) is defined by the ratio K/N. The lower the coding rate, the higher the number of redundancy bits, and, hence, the greater the protection against noise of the transmission channel.

These N-K bits are calculated with the help of a parity matrix H. The LDPC code is therefore also a code based on a matrix. This matrix has N-K rows and N columns and includes "1s" and of "0s", with a small number of "1s" relative to the number of "0s". This is the reason why codes of this type based on such a matrix are called "LDPC codes", that is to say low-density codes. The encoded block BLC, of N bits, is calculated by solving the equation $HBLC^T=0$, where H denotes the parity matrix and T the "transpose" function.

On the decoder side, the erroneous bits are corrected on the basis of the relationships between the coded items of the block. These relationships are given by the parity matrix H. The decoder uses internal metrics corresponding to the "1s" of the matrix H. The matrix H corresponds to the Tanner graph of the LDPC code comprising so-called check nodes and bit nodes interlinked by the path of the graphs that represent the messages exchanged iteratively between the nodes thus linked. These metrics are updated row-wise (updating of the check nodes) by taking account of the internal metrics of one and the same row. Thereafter, the decoder updates these metrics column-wise (updating of the bit nodes) by taking account of the internal metrics in one and the same column and also of the corresponding item at the input of the decoder that originates from the transmission channel. An iteration corresponds to the updating of the check nodes for all the internal metrics, followed by the updating of the bit nodes for all the internal metrics.

The decoding of a block uses several iterations. The values of the decoded bits, also called "hard decisions", are obtained by adding together the internal metrics column-wise with the items received and by taking the sign of the result. In other words, the sign of the result provides the value "0" or "1" of the bit while the absolute value of the result gives a confidence (probability) indication for this "0" or "1" logic value.

The LDPC-type codes are of interest since they make it possible to obtain very low bit error rates (BER) on account of the iterative nature of the decoding algorithm. Several iterative decoding algorithms exist for decoding LDPC codes, for example, the "belief propagation" (BP) classical algorithm well known to the person skilled in the art.

The duration of decoding of a block is directly related to the number of iterations used. Thus, to achieve a given bit rate, a maximum number of iterations is defined for each coding rate and each block will be decoded with the same number of iterations. For example, the maximum number of iterations may be fixed at 50. That being the case, if the decoding has not converged after these 50 iterations a reduction in the decoding performance results.

One possible approach may be to increase the maximum number of iterations permitted per block and in fixing it for example at 60. However, in this case, the bit rate would be divided by 6/5 because the duration of decoding of a block would be greater.

SUMMARY OF THE INVENTION

An object of the invention is to avoid fixing a priori a high number of iterations to obtain good performance.

According to one aspect, there is a method for decoding a succession of blocks encoded with an LDPC code, in which the blocks are stored temporarily and successively in input memory means or an input memory before decoding them successively in an iterative manner.

According to a general characteristic of this aspect, the input memory may have a memory size allowing the storage of more than two blocks. A current indication representative of a permitted maximum number of iterations for decoding a current block is defined. The current indication is initialized to a reference number of iterations increased by an additional number of iterations dependent on the additional memory size of the input memory allowing supplementary storage beyond two blocks. The current block is decoded until a decoding criterion is satisfied or so long as the number of iterations has not reached the current indication, while the first subsequent block and possibly a part of the second subsequent block is/are stored in the input memory. The current indication is updated for decoding the first subsequent block as a function of the number of iterations performed for decoding the current block.

Stated otherwise, the memory size of the input memory is increased in such a way as to benefit from an "additional reservoir of iterations" for the case where the decoding of a block has not converged after the reference number of iterations. Of course, this "additional reserve of iterations" is related to the subsequent memory size used and it is updated at the end of the decoding of a block, thus defining the additional number of iterations possibly still permitted for the subsequent block. Thus, this additional number of iterations is variable for each block. The additional number of iterations may be zero, or equal to or less than its maximum value, depending on the further iterations actually used for the decoding of the previous blocks.

According to one embodiment, in which each block comprises N items, the input memory comprises on the one hand p+q elementary memories, each capable of storing N/p items. Where p is greater than or equal to two, and q is greater than or equal to one. The additional number of iterations depends on the reference number of iterations, on p and on q, and on the other hand, a transfer memory capable of temporarily storing a block. The current block previously stored in the p elementary memories is transferred for the purpose of decoding the block.

According to the architecture used, the duration of transfer of the current block from the p elementary memories to the transfer memory may correspond to the duration of r decoding iterations, for example two decoding iterations. In this case, the additional number of iterations is equal to the product of the reference number times q/p decreased by the number r. In a particular embodiment, the encoded blocks comply with the DVB-S2 standard.

According to another aspect, there is proposed a decoder, possessing an input for receiving a succession of blocks encoded with an LDPC code, an input memory suitable for successively and temporarily storing the blocks, and decoding means or a decoder suitable for successively decoding the blocks in an iterative manner.

According to a general characteristic of this aspect, the input memory has a memory size allowing the storage of more than two blocks and the decoder comprises a storage means or storage containing a current indication representative of a maximum permitted number of iterations for decoding a current block, the indication initially representing a maximum permitted number of iterations equal to a reference number of iterations increased by an additional number of iterations dependent on the additional memory size of the input memory allowing supplementary storage beyond two blocks. The decoder further comprises a control means or a controller suitable for activating the decoding means or decoder for the current block until a decoding criterion is satisfied or so long as the number of iterations has not reached the current indication. The controller is also suitable for permitting the storage of the first subsequent block and possibly of a part of the second subsequent block in the input memory, and for updating the maximum value for decoding the first subsequent block as a function of the number of iterations of the current block.

According to one embodiment, in which each block comprises N items, the input memory comprises on the one hand p+q elementary memories, each capable of storing N/p items. Where p is greater than or equal to two, and q is greater than or equal to one. The additional number of iterations depends on the reference number of iterations, on p, and on q, and on the other hand, a transfer memory capable of temporarily storing a block. The controller is suitable for transferring the current block previously stored in p elementary memories into the transfer memory for the purpose of decoding the block.

According to another embodiment, the duration of transfer of the current block from the p elementary memories to the transfer memory corresponds to the duration of r decoding iterations, and the additional number of iterations is equal to the product of the reference number times q/p decreased by the number r.

According to yet another embodiment, in which each item is coded on n bits, the decoder comprises F processors in parallel, and the decoder furthermore comprises a linking bus connecting the output of the transfer memory to the F processors and having a size of F*n bits, a multiplexing means or a multiplexer connected between the elementary memories and the transfer memory, p+q input buses respectively linking the outputs of the p+q elementary memories to the p+q inputs of the multiplexer, and an output bus linking the output of the multiplexer to the input of the transfer memory. The input and output buses each have a size equal to a submultiple of the size of the linking bus.

Such an embodiment may make it possible to reduce the routing problems, in particular when the blocks comprise a large number of items, for example 64,800 in the DVB-S2 standard. According to another aspect, there is furthermore proposed a signal receiver complying with the DVB-S2 standard, incorporating the decoder as defined hereinabove.

BRIEF DESCRIPTION OF THE DRAWINGS

Other advantages and features will become apparent on examining the detailed description of embodiments and modes of implementation, which are in no way limiting, and the appended drawings, in which.

DETAILED DESCRIPTION OF THE PREFERRED EMBODIMENTS

Embodiments and modes of implementation will now be described in greater detail in the case of a DVB-32 application for which the length of the encoded blocks is 64,800 bits, although the embodiments are valid for all sizes of blocks.

Figure 1:
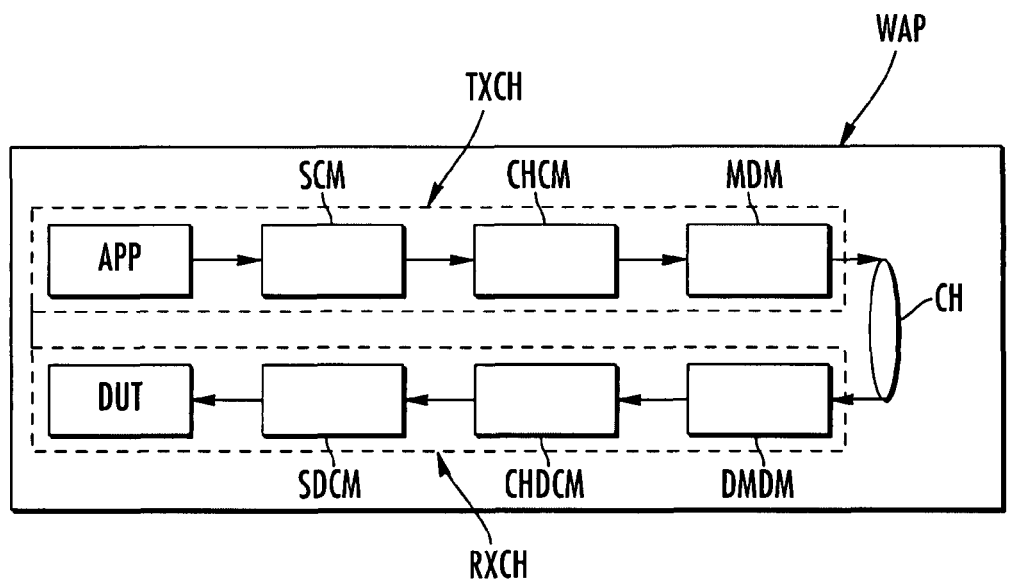
FIG. 1 schematically illustrates the internal structure of a wireless apparatus incorporating a decoder according to the invention.

In FIG. 1, the reference WAP denotes a wireless apparatus that can be used in a communication system complying with the DVB-S2 standard. The wireless apparatus WAP comprises a transmission chain TXCH capable of transmitting coded and modulated information over a transmission channel CH, for example the air. Furthermore, this apparatus WAP also comprises a reception chain RXCH capable of receiving and decoding information originating from the transmission channel CH.

The transmission chain TXCH conventionally comprises, in a manner known, source coding means or a source coder SCM that receive application data APP so as in particular to compress them to reduce the data bit rate. The transmission chain also comprises channel coding means or a channel coder whose function is in particular to add redundancy so as to be able subsequently to correct the potential reception errors due to the noise of the transmission channel. These channel coding means comprise, for example, LDPC coding means or a LDPC coder.

The transmission chain also comprises modulation means or a modulator MDM so as to adapt the signal to the transmission channel (satellite channel or radio channel, for example). The reception chain RXCH comprises corresponding means or circuitry performing the inverse functions. More precisely, there are demodulation means or a demodulator DMDM, followed by channel decoding means or a channel decoder CHDCM that comprise for example an LDPC decoder, followed by source decoding means or a source decoder SDCM delivering to the user the user data DUT corresponding to the application data APP.

Figure 2:
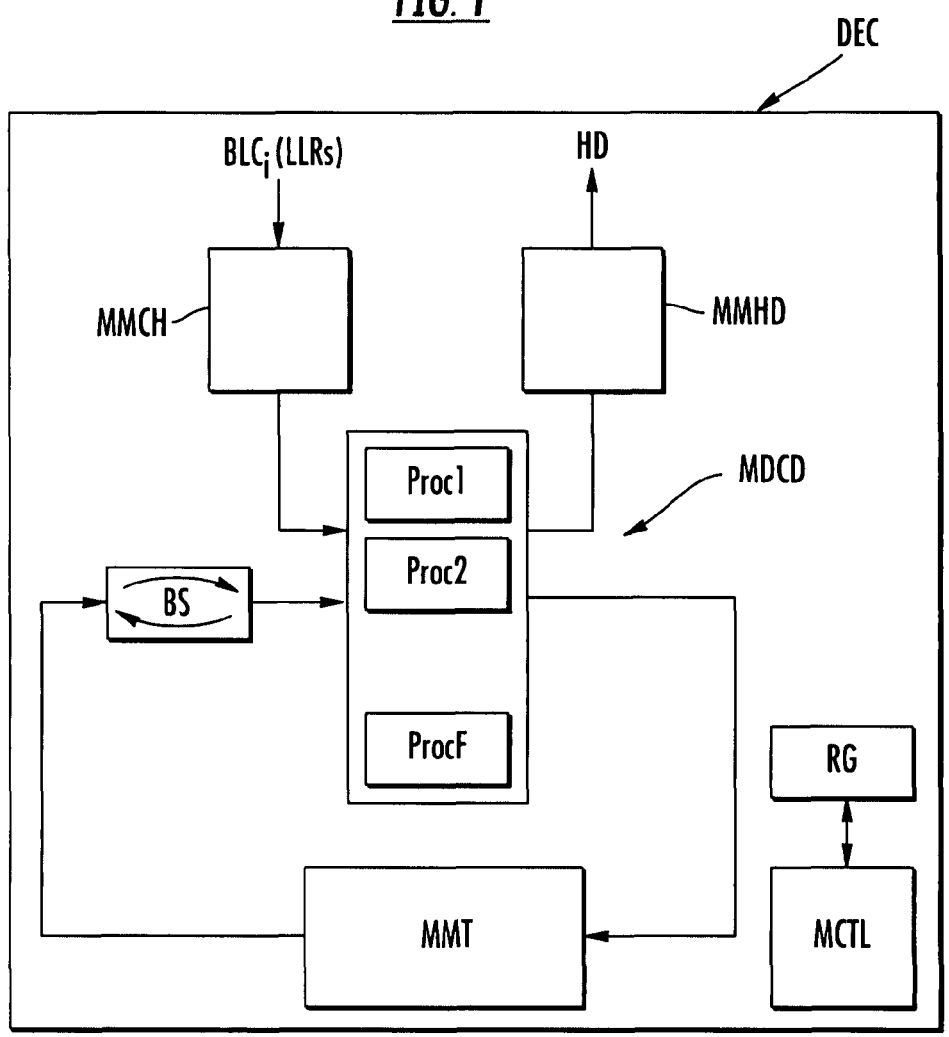
FIG. 2 illustrates in greater detail, but still schematically, an embodiment of an LDPC decoder according to the invention, FIG. 3 schematically illustrates an exemplary embodiment of an input memory of an LDPC decoder according to the prior art.

Referring more particularly now to FIG. 2, it may be seen that an exemplary LDPC decoder, referenced DEC, essentially and schematically comprises input memory means or an input memory MMCH, decoding means or a decoder MDCD, output memory means or an output memory MMHD and control means or a controller MCTL. The input memory MMCH receives a succession of blocks $BLC_i$ encoded with an LDPC code. Each block comprises N coded items, N being equal to 64,800 in the DVB-S2 standard.

These items are probability ratios and are generally known to the person skilled in the art by the name LLR ("log likelihood ratio"). These items are coded on n bits. The sign of each item is representative of its logic value, while its absolute value is representative of the confidence that the logic value of this item is correct. The internal architecture of the input memory MMCH will be discussed again in greater detail hereinbelow.

Each received block $BLC_i$ is decoded in the decoder MDCD comprising, in this example, F processors operating in parallel, F being equal to 360 in an application of the DVB-S2 standard. The battery of F processors performs the updating of the check nodes and of the bit nodes. A metrics memory MMT contains the internal metrics (equal in number to the number of "1s" in the parity matrix).

A conventional known mixing device (which is a shifting device in the case of an LDPC coding applied to the DVB-S2 standard) makes it possible to place the right data opposite the right processors. During the iterative decoding, the channel items, initialized with the items of the block to be decoded, are updated with the help of the updated metrics. Finally, on completion of the decoding, the processors deliver, into the memory MMHD, the N hard decisions corresponding to the N decoded logic values of the block $BLC_i$. These N hard decisions are the signs of the channel items updated at the last iteration.

Figure 3:
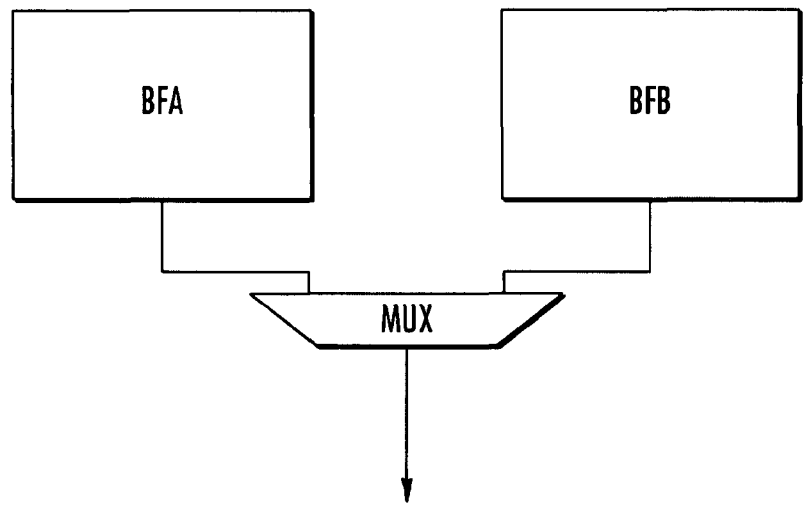

In a prior-art approach illustrated in FIG. 3, the input memory comprises two buffer memories BFA, BFB each capable of storing a block. Of course, the architecture of the decoder and also the characteristics of the memory are chosen in such a way that the duration of decoding of an entire block is less than the duration for receiving and storing an entire block. In practice, these two durations are relatively similar. This is the reason why a time constraint analysis uses two buffer memories in which the blocks are stored alternately. One buffer memory is used for decoding a block, while the subsequent block is stored in the other buffer memory, and vice versa.

Although the input memory of the prior art allows the storage of only two blocks, the input memory according to one embodiment of the invention allows the storage of more than two blocks, and this will make it possible, as will be explained in greater detail hereinbelow, to obtain a reservoir of additional iterations for decoding the blocks. Also, the additional number of iterations permitted depends on the additional memory size of the input memory allowing supplementary storage beyond two blocks.

Figure 4:
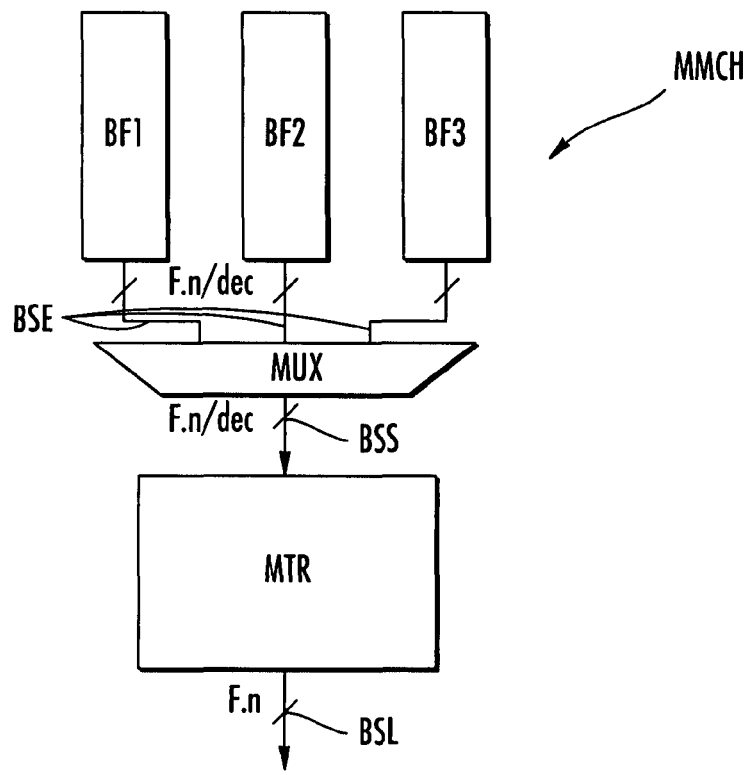
FIG. 4 illustrates in greater detail an exemplary architecture of an input memory of a decoder according to the invention.

In the embodiment illustrated in FIG. 4, the input memory comprises, on the one hand, p+q elementary memories $BF_i$ each capable of storing N/p items (LLRs). The value p is greater than or equal to 2, and the value q is greater than or equal to 1 and less than p. That having been, q could also be chosen greater than or equal to p so as to obtain a bigger reservoir of additional iterations.

In the present case, p is equal to 2 and q is equal to 1. There are, therefore, three elementary memories BF1-BF3 each capable of storing N/2 items, that is to say half an input block. The input memory comprises on the other hand a transfer memory MTR capable of temporarily storing a block, that is to say it has a storage capacity of N items.

Such an architecture makes it possible to obtain a maximum additional number of permitted iterations, denoted EXTRA, equal to (q*NREF/p)−r, where NREF denotes a reference number of iterations that is fixed and corresponds to the maximum number of iterations used for correct decoding of the majority of blocks. For example NREF may be taken equal to 50.

It will be seen in greater detail that, in the example described here, the duration of transfer between the elementary memories $BF_i$ and the transfer memory MMT corresponds to the duration of execution of two iterations of the coder. That being the case, depending on the architecture used and depending on the applications, this number r may be bigger or else negligible.

Figure 5:
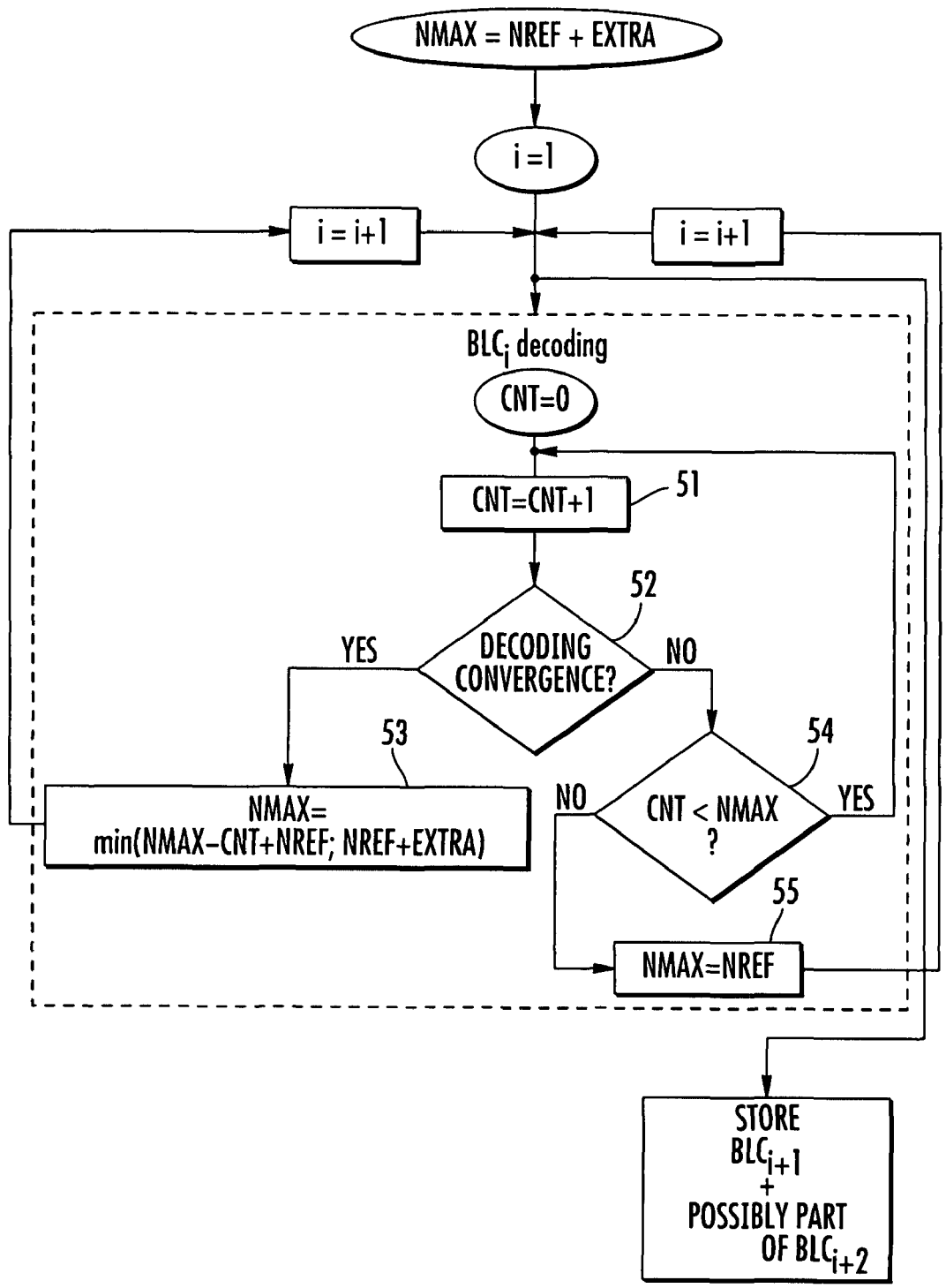
FIG. 5 is a flow chart representative of a mode of implementation of a decoding method according to the invention using possible additional iterations.

Before discussing in greater detail the size of the buses linking the memories $BF_i$ to the transfer memory MMT via the multiplexer MUX, the mechanism for managing the additional iterations that may possibly be used for decoding a block will be described while referring more particularly to FIG. 5. A storage means or storage, for example a register, RG (FIG. 2) contains a current indication NMAX representative of the maximum permitted number of iterations for decoding a current block $BLC_i$. This value NMAX is initialized to the value (NREF+EXTRA), EXTRA being equal in the present case to the value 23. Consequently, the value NMAX is initialized to the value 73 (50+23).

The control means or controller MCTL (FIG. 2) comprises an iteration counter CNT, which, at the start of the decoding of each current block $BLC_i$, is initialized to the value "0". The iterative decoding of the block $BLC_i$ is then performed by incrementing the value of the counter CNT at each iteration (step 51). On completion of each iteration, a check is carried out to verify whether the decoding has converged (step 52).

Here, a conventional criterion for checking convergence of the decoding is used, for example, after each iteration, the vector of hard decisions is multiplied by the parity matrix and a check is carried out to verify whether a zero vector is obtained. In this case, it is certain that a word of the code has been obtained, or else, a check is carried out to verify the stability of the outputs of the decoder from one iteration to the next. It is then possible to decide that convergence has occurred a priori. Thus, the decoding of the current block BLCi is continued until the decoding criterion is satisfied or so long as the number of iterations has not reached the current indication NMAX (step 54).

If the number of iterations has reached the current indication NMAX, then this indication NMAX is updated with the value NREF (step 55). Stated otherwise, this implies that, if the decoding of the current block has used the maximum number of permitted additional iterations, then the maximum number of iterations permitted for decoding the subsequent block will again be NREF.

If on the other hand the decoding of the current block $BLC_i$ has converged before the number of iterations defined by the counter CNT has reached the value NMAX, this current value NMAX is updated in step 53 as being the smaller of the following two values: NMAX−CNT+NREF and NREF+EXTRA. In fact, in absolute terms, the maximum number of iterations for a block cannot exceed NREF+EXTRA.

While the current block $BLC_i$ is being decoded on the basis of the content of the transfer memory MMT, the first subsequent block $BLC_{i+1}$ is stored in the two elementary memories available and possibly a part of the second subsequent block $BLC_{i+2}$ is also stored in one of the vacant elementary memories if, for example, the current block $BLC_i$ being decoded uses additional iterations.

The controller MCTL may be embodied in software fashion within a microcontroller or else by a logic circuit realized through logic synthesis tools based on the operating flow chart. Of course, the person skilled in the art will be able to adapt the architecture of the decoder and also the characteristics of the read and write access times of the input memory in such a way that the duration for storing a block is greater than or equal to the duration used for decoding this block increased by the duration for transferring items into the transfer memory. In practice, these durations are substantially equal.

Figure 6:
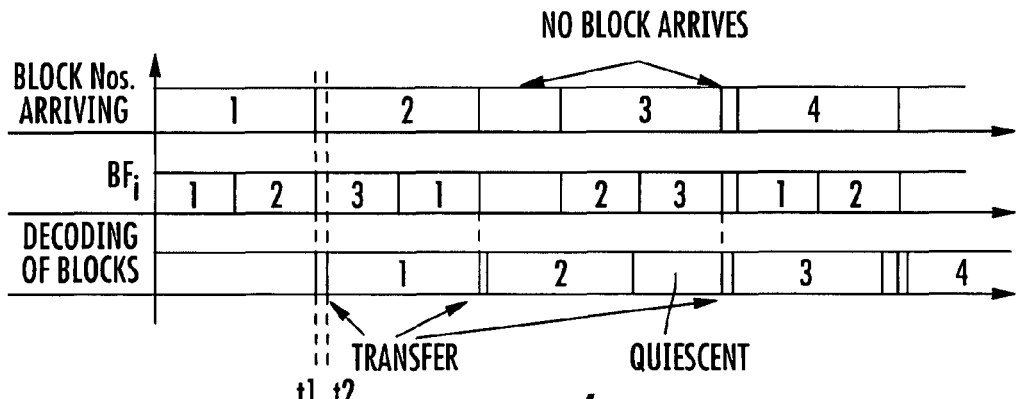
FIGS. 6 to 8 represent in a simplified manner timing diagrams relating to various examples of possible uses of additional iterations.

FIG. 6 gives a first exemplary use of the elementary memories and a visualization of the transfer duration. In this example, it is assumed that no additional iteration is used. At the instant t1, the elementary memories BF1 and BF2 are used to store the first block. Between the instants t1 and t2, the elementary memory BF3 is used to store the second block. At the instant t2, the elementary memories BF1 and BF2 are vacant because the transferring of the block $BLC_1$ to the transfer memory MT has finished. Thus, at any instant there is at least almost one elementary memory vacant, this corresponding to half the duration of decoding of a block decreased by two iterations (corresponding to the duration of transfer).

When the decoder has converged with a lower number of iterations than the number NREF (which is frequently the case for customary signal-to-noise ratios), the additional iterations used previously may again be available to be reused, possibly, for the subsequent blocks if necessary. Thus, according to the embodiment, at least NREF iterations may be executed for each block.

Figure 7:
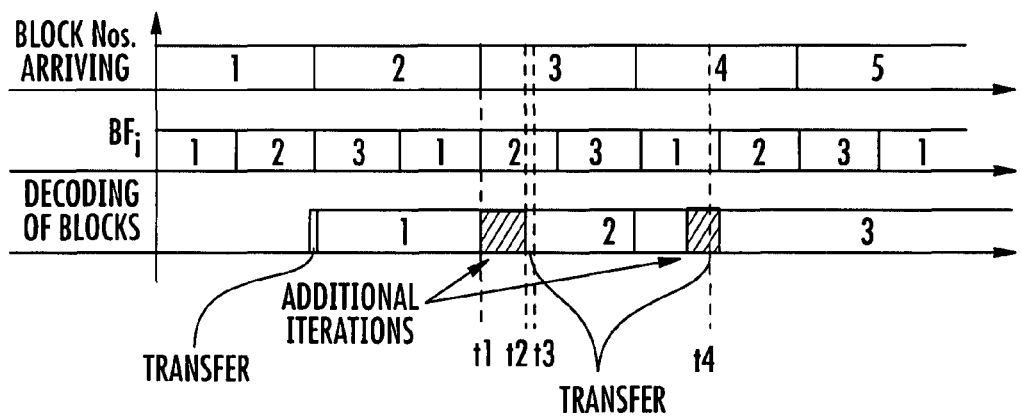
Figure 8:
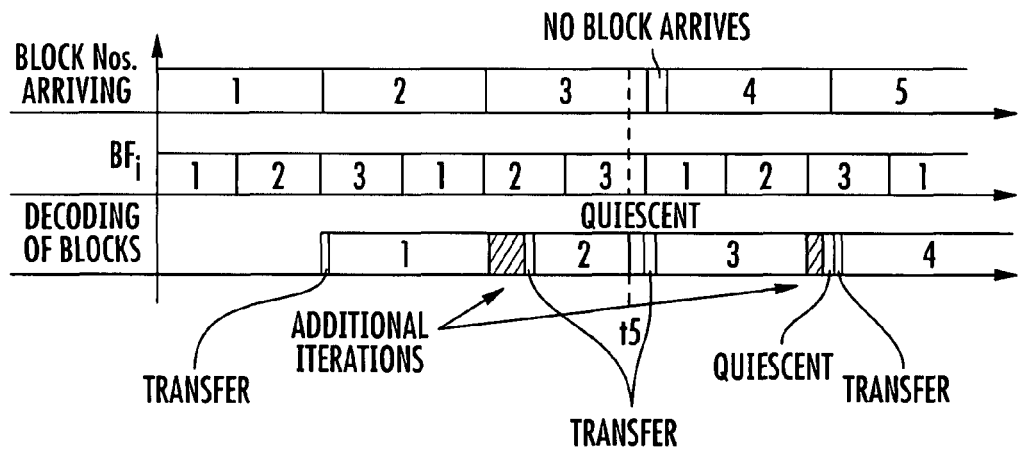

FIGS. 7 and 8 illustrate examples of managing additional iterations. At the instant t1, NREF iterations have been used to decode the first block, but the decoding of this first block has not finished. During the decoding of this first block, block No. 2 is stored in the elementary memories BF3 and BF1. Between the instants t1 and t2, a few additional iterations have been used to finish the decoding of block 1 while the start of block 3 has been stored in a part of the elementary memory BF2.

Between the instants t2 and t3, block No. 2 is transferred from the elementary memories BF3 and BF1 to the transfer memory MMT and then block 2 is decoded here again with a few additional iterations, up to the instant t4. Block No. 3 is then transferred to the transfer memory MMT. In the timing diagram of FIG. 8 it may be seen that the first block has consumed a certain number of additional iterations. However, the second block is decoded with a smaller number of iterations than the number NREF (instant t5 marking the end of the decoding block 2). Consequently, it is possible to at least partly rebuild the credit of additional iterations used for decoding block 1. Also, so long as block 3 has not been completely stored in the elementary memories BF2 and BF3 with a view to being transferred to the transfer memory, the decoder is quiescent. Next, after the transfer of block 3 to the transfer memory, block 3 is decoded, here with a few additional iterations.

Reference is made again to FIG. 4 to detail the size of the buses used. As illustrated in FIG. 4, the decoder comprises a linking bus BSL linking the output of the transfer memory MTR to the F processors and of a size (width of bits) of F×n bits (the LLRD items of the blocks are coded on n bits).

Moreover, p+q input buses BSE respectively link the outputs of the p+q elementary memories to the p+q inputs of the multiplexing means MUX controlled by the control means MCTL. Finally, an output bus BSS links the output of the multiplexing means MUX to the input of the transfer memory. So as to limit the routing problems, in particular for significant computational parallelism, the size of the input and output buses is equal to a sub-multiple of the size of the linking bus. In this instance, the size of this input bus BSE and this output bus BSS is equal to F*n divided by a factor dec equal, for example, to 6. In this case, the multiplexing means or a multiplexer have only to multiplex three groups of F*n/6 bits.

The duration used to transfer the data from the elementary memories to the transfer memory is equal to $N*n/(F*n/dec)$, i.e. N*dec/F clock cycles. In the case of a DVB-S2 application (N=64,800), this duration is equal to 64,800*6/F. This corresponds with a conventional architecture of F=360 processors, to a duration of two decoding iterations in the worst case.

Figure 9:
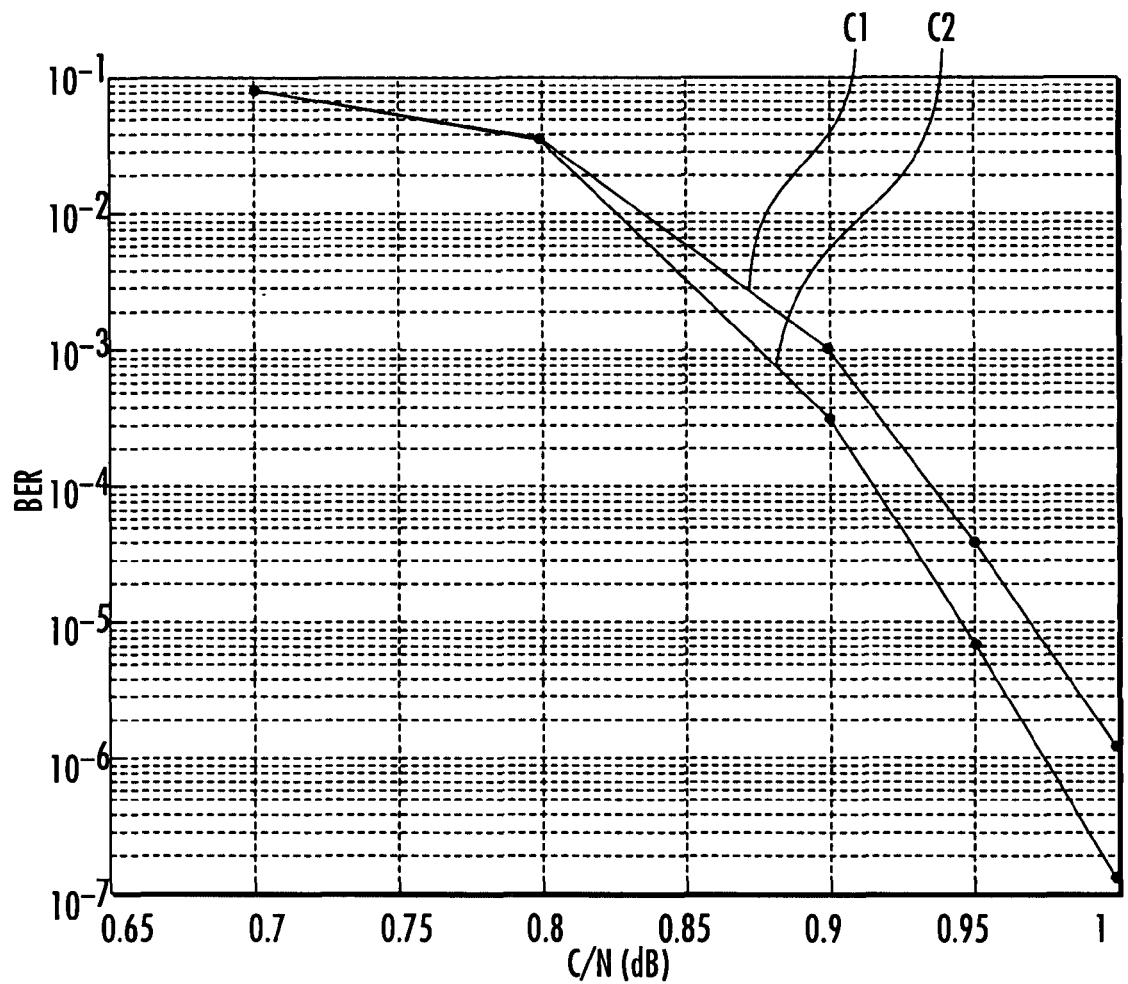
FIGS. 9 and 10 are graphs of the bit error rate as a function of signal-to-noise ratio, wherein C1 is according to the prior art, and C2 is according to the invention.

FIG. 9 illustrates the evolution of the bit error rate BER as a function of the signal-to-noise ratio for parity matrices of the DVB-S2 type with block lengths (N) equal to 64,800 bits, QPSK modulation and coding rate of ½. The decoding algorithm used is the conventional BP algorithm. The standard number of iterations is fixed at 50 and the number EXTRA of additional iterations is fixed at 23.

Figure 10:
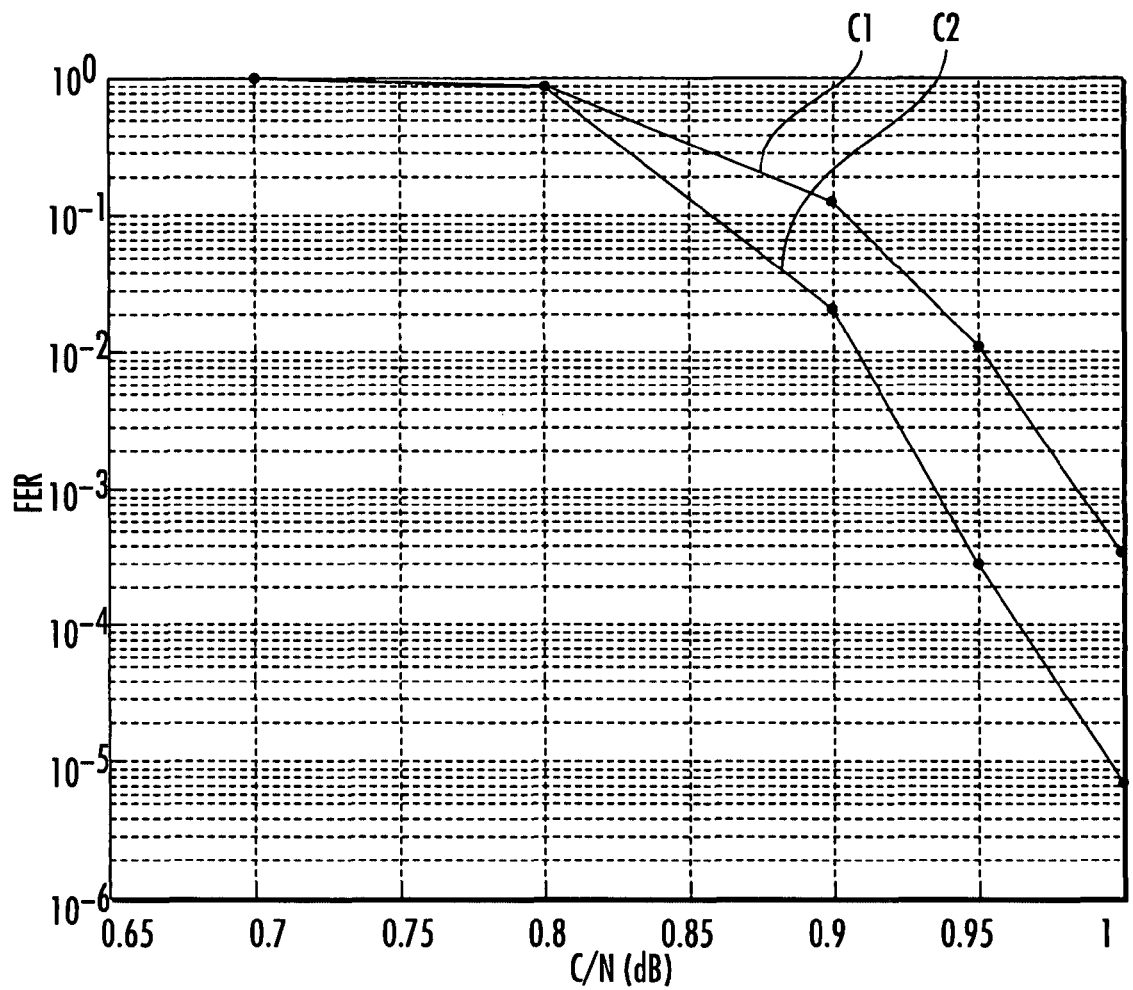

Curve C1 shows the evolution of the BER rate for decoding according to the prior art while curve C2 shows the evolution of the BER rate for decoding according to the invention. This time, curve C1 of FIG. 10 illustrates, under the same conditions, the block error rate FER for decoding according to the prior art while curve C2 of FIG. 10 relates to the evolution of the FER rate for decoding according to the invention. Hence, in both cases a reduction in the BER rate and in the FER rate is obtained. The gain is around 0.03 dB for a sufficient ratio C/N (signal/noise).

The embodiments just described are compatible with any type of iterative LDPC decoding, such as for example the BP algorithm, or else a layered iterative decoding algorithm, such as, for example, that known to the person skilled in the art as "layered BP", or else a layered iterative decoding such as that described in the French patent application filed in the name of the applicant on the same day as the present application and entitled. "Procédé et dispositif de décodage par couches d'une succession de blocs encodés avec un code LDPC" [Method and device for layered decoding of a succession of blocks encoded with an LDPC code].

That which is claimed:

1. A method for decoding a succession of blocks of data encoded with a low-density parity-check (LDPC) code comprising:
   storing the blocks temporarily and successively in an input memory before decoding the blocks successively in an iterative manner, the input memory having a memory size for storage of at least two blocks;
   defining a current indication representative of a threshold number of iterations for decoding a current block, the current indication initialized to a reference number of iterations increased by an additional number of iterations dependent on an additional memory size of the input memory for supplementary storage greater than two blocks;
   decoding the current block until a decoding criterion is satisfied or so long as a number of iterations performed for decoding the current block has not reached the current indication while at least one of a first subsequent block and a part of a second subsequent block are stored in the input memory; and updating the current indication for decoding the first subsequent block as a function of the number of iterations performed for decoding the current block.

2. The method according to claim 1 wherein each block comprises N groups of bits; wherein the input memory comprises p+q elementary memories, each storing N/p groups of bits, p being greater than or equal to two and q being greater than or equal to one, the additional number of iterations depending on the reference number of iterations, p, and q; and wherein a transfer memory temporarily stores each block, each block being previously stored in p elementary memories and transferred to the transfer memory for the decoding of each block.

3. The method according to claim 2 wherein a duration of transfer of the current block from the p elementary memories to the transfer memory corresponds to a duration of r decoding iterations; wherein the additional number of iterations is equal to a product of the reference number times q/p subtracted by r.

4. The method according to claim 1 wherein the encoded blocks comply with a Digital Video Broadcasting—Satellite—Second Generation (DVB-S2) standard.

5. A method for decoding a succession of blocks of data encoded with a low-density parity-check (LDPC) code comprising:

storing the blocks temporarily and successively in an input memory having a memory size for storage of at least two blocks;

defining a current indication representative of a threshold number of iterations for decoding a current block, the current indication initialized to a reference number of iterations increased by an additional number of iterations dependent on an additional memory size of the input memory;

decoding, successively and in an iterative manner, the current block until a decoding criterion is satisfied or so long as a number of iterations performed for decoding the current block has not reached the current indication while at least a first subsequent block is stored in the input memory; and updating the current indication for decoding the first subsequent block as a function of the number of iterations performed for decoding the current block.

6. The method according to claim 5 wherein each block comprises N groups of bits; wherein the input memory comprises p+q elementary memories, each storing N/p groups of bits, p being greater than or equal to two and q being greater than or equal to one, the additional number of iterations depending on the reference number of iterations, p, and q; and wherein a transfer memory temporarily stores each block, each block being previously stored in p elementary memories and transferred to the transfer memory for the decoding of each block.

7. The method according to claim 6 wherein a duration of transfer of the current block from the p elementary memories to the transfer memory corresponds to a duration of r decoding iterations; wherein the additional number of iterations is equal to a product of the reference number times q/p subtracted by r.

8. The method according to claim 6 wherein the encoded blocks comply with a Digital Video Broadcasting—Satellite—Second Generation (DVB-S2) standard.

9. A decoding apparatus comprising:

an input configured to receive a succession of blocks of data encoded with a low-density parity-check (LDPC) code;

an input memory configured to successively and temporarily store the blocks and to have a memory size for a storage of at least two blocks; and a decoder configured to successively decode the blocks in an iterative manner and comprising:

a storage configured to store a current indication representative of a threshold number of iterations for decoding a current block, the current indication initially representing the threshold number of iterations and equal to a reference number of iterations increased by an additional number of iterations dependent on an additional memory size of said input memory for supplementary storage of greater than two blocks, and a controller configured to activate said decoder for the current block until a decoding criterion is satisfied or so long as a number of iterations performed for decoding the current block has not reached the current indication, store at least one of a first subsequent block and a part of a second subsequent block in said input memory, and update a threshold value for decoding the first subsequent block as a function of the number of iterations performed for decoding the current block.

10. The decoding apparatus according to claim 9 wherein each block comprises N groups of bits; wherein said input memory comprises p+q elementary memories, each configured to store N/p groups of bits, p being greater than or equal to two and q being greater than or equal to one, the additional number of iterations depending on the reference number of iterations, p, and q; and further comprising a transfer memory configured to temporarily store each block, said controller configured to transfer the current block previously stored in p elementary memories into said transfer memory for the decoding of the block.

11. The decoding apparatus according to claim 10 wherein a duration of transfer of the current block from the p elementary memories to said transfer memory corresponds to the duration of r decoding iterations; and wherein the additional number of iterations is equal to a product of the reference number times q/p subtracted by r.

12. The decoding apparatus according to claim 10 wherein each group of bits is coded on n bits; and further comprising:
F parallel processors;
a linking bus configured to couple an output of said transfer memory to said F parallel processors and having a size of F*n bits;
a multiplexer coupled between the elementary memories and said transfer memory;
p+q input buses configured to respectively link outputs of said p+q elementary memories to p+q inputs of said multiplexer; and
an output bus configured to link an output of said multiplexer to an input of said transfer memory, said input and output buses each having a size equal to a submultiple of the size of said linking bus.

13. The decoding apparatus according to claim 9 wherein the encoded blocks comply with a Digital Video Broadcasting—Satellite—Second Generation (DVB-S2) standard.

14. A decoding apparatus comprising:
an input memory configured to successively and temporarily store a succession of blocks of data encoded with a low-density parity-check (LDPC) code and to have a memory size for a storage of at least two blocks; and a decoder configured to successively decode the blocks in an iterative manner and comprising:

a storage configured to store a current indication representative of a threshold number of iterations for decoding a current block, the current indication initially representing the threshold number of iterations and equal to a reference number of iterations increased by an additional number of iterations dependent on an additional memory size of said input memory, and a controller configured to activate said decoder for the current block until a decoding criterion is satisfied or so long as a number of iterations performed for decoding the current block has not reached the current indication, store at least a first subsequent block, and update a threshold value for decoding the first subsequent block as a function of the number of iterations performed for decoding the current block.

15. The decoding apparatus according to claim 14 wherein each block comprises N groups of bits; wherein said input memory comprises p+q elementary memories, each configured to store N/p groups of bits, p being greater than or equal to two and q being greater than or equal to one, the additional number of iterations depending on the reference number of iterations, p, and q; and further comprising a transfer memory configured to temporarily store each block, said controller configured to transfer the current block previously stored in p elementary memories into said transfer memory for the decoding of the block.

16. The decoding apparatus according to claim 15 wherein each group of bits is coded on n bits; and wherein said decoder further comprises:

F parallel processors;

a linking bus configured to couple an output of said transfer memory to said F parallel processors and having a size of F*n bits;

a multiplexer coupled between the elementary memories and said transfer memory;

p+q input buses configured to respectively link outputs of said p+q elementary memories to p+q inputs of said multiplexer; and an output bus configured to link an output of said multiplexer to an input of said transfer memory, said input and output buses each having a size equal to a submultiple of the size of said linking bus.

17. A signal receiver complying with a Digital Video Broadcasting—Satellite—Second Generation (DVB-S2) standard and comprising a decoding apparatus, said decoding apparatus comprising:

an input memory configured to successively and temporarily store a succession of blocks of data encoded with a low-density parity-check (LDPC) code and to have a memory size for a storage of at least two blocks; and a decoder configured to successively decode the blocks in an iterative manner and comprising:

a storage configured to store a current indication representative of a threshold number of iterations for decoding a current block, the current indication initially representing the threshold number of iterations and equal to a reference number of iterations increased by an additional number of iterations dependent on an additional memory size of said input memory, and a controller configured to activate said decoder for the current block until a decoding criterion is satisfied or so long as a number of iterations performed for decoding the current block has not reached the current indication, store at least a first subsequent block, and update a threshold value for decoding the first subsequent block as a function of the number of iterations performed for decoding the current block.

18. The signal receiver according to claim 17 wherein each block comprises N groups of bits; wherein each group of bits is coded on n bits; and wherein said decoder further comprises:

F parallel processors;

a linking bus configured to couple an output of said transfer memory to said F parallel processors and having a size of F*n bits;

a multiplexer coupled between the elementary memories and said transfer memory;

p+q input buses configured to respectively link outputs of said p+q elementary memories to p+q inputs of said multiplexer; and an output bus configured to link an output of said multiplexer to an input of said transfer memory, said input and output buses each having a size equal to a submultiple of the size of said linking bus.

19. The signal receiver according to claim 17 wherein the encoded blocks comply with the Digital Video Broadcasting—Satellite—Second Generation (DVB-S2) standard.

* * * * *